United States Patent
Ooi et al.

(10) Patent No.: US 8,723,575 B1
(45) Date of Patent: May 13, 2014

(54) CONFIGURABLE DELAY CIRCUITRY WITH COMPENSATED DELAY

(75) Inventors: Ee Mei Ooi, Bayan Lepas (MY); Kin Hong Au, Perai (MY); Ket Chiew Sia, Bayan Lepas (MY); Yan Chong, San Jose, CA (US); Joseph Huang, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/554,293

(22) Filed: Jul. 20, 2012

(51) Int. Cl.
  *H03H 11/26* (2006.01)
(52) U.S. Cl.
  USPC ............................ 327/262; 327/281; 327/288
(58) Field of Classification Search
  USPC ......... 327/261–264, 276–278, 281, 284, 285, 327/288
  See application file for complete search history.

(56) References Cited

U.S. PATENT DOCUMENTS

| | | | |
|---|---|---|---|
| 4,805,195 A | 2/1989 | Keegan | |
| 4,845,390 A | 7/1989 | Chan | |
| 5,933,039 A | 8/1999 | Hui et al. | |
| 6,674,314 B2 * | 1/2004 | Takai | 327/158 |
| 7,117,382 B2 | 10/2006 | Khieu et al. | |
| 7,317,333 B1 * | 1/2008 | Zhou et al. | 326/80 |
| 7,639,054 B1 | 12/2009 | Burney | |
| 7,880,505 B2 | 2/2011 | Khatri et al. | |
| 2001/0028269 A1 * | 10/2001 | Shuler, Jr. | 327/277 |
| 2003/0193351 A1 * | 10/2003 | Fukui | 326/83 |
| 2013/0033297 A1 * | 2/2013 | Heo | 327/288 |

* cited by examiner

*Primary Examiner* — William Hernandez
(74) *Attorney, Agent, or Firm* — Chih-Yun Wu

(57) ABSTRACT

An integrated circuit may include a delay circuit that receives an input signal at a first logic level and produces a delayed output signal at a second logic level at an output terminal. The integrated circuit may include a preset circuit coupled to the delay circuit. The preset circuit may receive the input signal and pre-drive the delayed output signal to an intermediate logic level that lies between the first and second logic levels.

20 Claims, 5 Drawing Sheets

CONFIGURABLE DELAY CIRCUITRY WITH COMPENSATED DELAY

BACKGROUND

Integrated circuit devices typically include logic blocks that are configurable to perform any of a variety of functions. Such devices are also generally configurable to communicate with external circuitry that may be connected to them through different input-output protocols.

As an example, an integrated circuit device such as a field programmable gate array (FPGA) device may be configured as a memory controller that communicates with a memory module through a memory interface such as a double data rate (DDR) interface. As the integrated circuit device and any external circuitry connected to it may operate at different speeds, data streams read from the external circuitry may need to be properly calibrated.

In DDR communications, for example, data may be read during both the rising and falling edges of a corresponding clock signal. As such, the data stream may need to be aligned with the clock edges. Accordingly, in a memory interface, such as a DDR interface, delay lines are widely used to delay an input data stream to ensure the data transitions are properly aligned with the clock signals.

The delay lines may be configurable and may be used to provide different periods of delay to a delay circuit such as a delay locked loop (DLL). A delay line or delay circuit must therefore need to be able to provide a stable delay to ensure that the data read is properly calibrated.

A tapped delay line, typically formed by a series of CMOS inverters, is generally used to provide a fixed delay. In a tapped delay line, outputs from the series of inverters are "tapped" and coupled to a multiplexer or selector circuit. The multiplexer may then select one of the tapped outputs depending on the desired delay.

However, even though the tapped delay line may be used to provide a configurable delay period, the output delay may not be well-controlled against jitter. As the speed of the memory interface increases, the tapped delay line may experience jitter or delay variations, depending on supply voltage variations.

Furthermore, as a multiplexer may be needed to select or tap the multiple delay outputs, each delay output needs to be routed to an appropriate input terminal on the multiplexer. As such, there may be routing congestion when long wires from the outputs of the delay line are routed to the multiplexer or selector circuit. The long wire may add unwanted delay to the outputs of the delay line, causing non-uniformed outputs to be produced by the delay line.

Therefore, based on all these different factors, a fixed delay may not be obtained due to undesirable jitter and inconsistent routing delay.

SUMMARY

A configurable delay line or delay circuit that is capable of generating a compensated delay output may help provide stable delay with reduced jitter. Embodiments of the present invention include circuits and techniques for selectively compensated or uncompensated delayed outputs. It is appreciated that the present invention can be implemented in numerous ways, such as a process, an apparatus, a system, or a device.

An integrated circuit may include a delay circuit that receives an input signal at an input and produces a delayed output signal at an output. The received input signal may have a first logic level. The delayed output signal may be produced having a second logic level that is different from the first logic level. The integrated circuit may include a preset circuit that receives the input signal and pre-drives the delayed output signal to an intermediate logic level that is between the first logic level and the second logic level (e.g., the preset circuit may drive the output to the intermediate logic level before the delay circuit has driven the output to the second logic level).

As an example, the preset circuit may include transistors having channel lengths that are shorter than channel lengths of transistors used to form the delay circuit. In this scenario, the transistors of the preset circuit may drive the output of the delay circuit with a larger amount of current than transistors of the delay circuit, thereby driving the output of the delay circuit to the intermediate logic level at a faster rate than by the delay circuit alone.

By driving the output of the delay circuit to an intermediate value using the preset circuit, jitter associated with power supply variations, process variations, temperature variations, or other sources of noise may be reduced (e.g., because transistors having relatively high current driving capabilities may be less susceptible to noise).

The preset circuit may be disabled after the output of the delay circuit has been driven to the intermediate logic level. For example, a feedback path may be coupled from the output of the delay circuit to an input of the preset circuit. In this scenario, the feedback path may be used to detect when the output has been driven to the intermediate logic level and to disable the preset circuit when the intermediate logic level has been reached.

The integrated circuit may include a first set of transistors with at least one transistor having a first channel length. The first set of transistors may receive an input signal at a first logic level and produce an output signal at a second logic level. A second set of transistors, coupled in series to each other, may be coupled in parallel to the first set of transistors. At least one transistor of the second set of transistors may have a second channel length. The second set of transistors may pre-drive the output signal to an intermediate logic level that is between the first logic level and the second logic level.

A method of delaying an input signal to produce an output signal is also disclosed. The method includes receiving the input signal at a first logic level with a first delay circuit (e.g., a preset circuit). The output signal may be driven from the first logic level to a second logic level by the first delay circuit. The first delay circuit may be powered down (e.g., disabled) by control circuitry when the output signal reaches the second logic level. The output signal may be subsequently driven from the second logic level to a third logic level by a second delay circuit.

Further features of the invention, its nature and various advantages will be more apparent from the accompanying drawings and the following detailed description of the preferred embodiments.

DETAILED DESCRIPTION

The embodiments provided herein include circuitry and techniques to provide a substantially uniform delay with reduced jitter.

It will be obvious, however, to one skilled in the art, that the present exemplary embodiments may be practiced without some or all of these specific details. In other instances, well-known operations have not been described in detail in order not to unnecessarily obscure the present embodiments.

An integrated circuit (IC) or a programmable logic device (PLD) may include delay circuitry that may be operable to delay input-output signals in order to properly align the signals with its internal clock. As mentioned above, a PLD may be coupled to other external circuitry through various input-output interfaces. For instance, when the device is communicating with an external memory module, different memory interfaces may be used (e.g., single data rate (SDR), double data rate (DDR), etc.). To ensure that data from the external memory module are properly read, the data stream from the external memory module needs to be properly aligned with the device's clock source.

Generally, a tapped delay circuit may be used to provide the desired delayed. However, as described above, a tapped delay circuit may not be able to provide a truly uniform delay and may experience a relatively high amount of jitter, especially in the presence of voltage variation. One of the described embodiments provides a delay circuit that may be able to provide compensated delayed outputs with reduced jitter even when experiencing a high voltage variation.

The delay circuit may include a preset circuit that is operable to pre-drive an input signal to a certain voltage level prior to outputting a delayed version of that signal. In one embodiment, the preset circuit may be turned on or off to provide either a compensated and or an uncompensated delay. Several similar delay circuits may be coupled together to form a chain of delay circuits. The chained delay circuits may be configurable to provide different delay values as desired. In one embodiment, the delay circuit with a preset circuit may be used to pre-drive or enhance the rising edge of a signal transitioning from a low logic level to a high logic level, and may pre-drive the falling edge of the signal when it transitions from the logic high level back to the logic low level.

Figure 1:
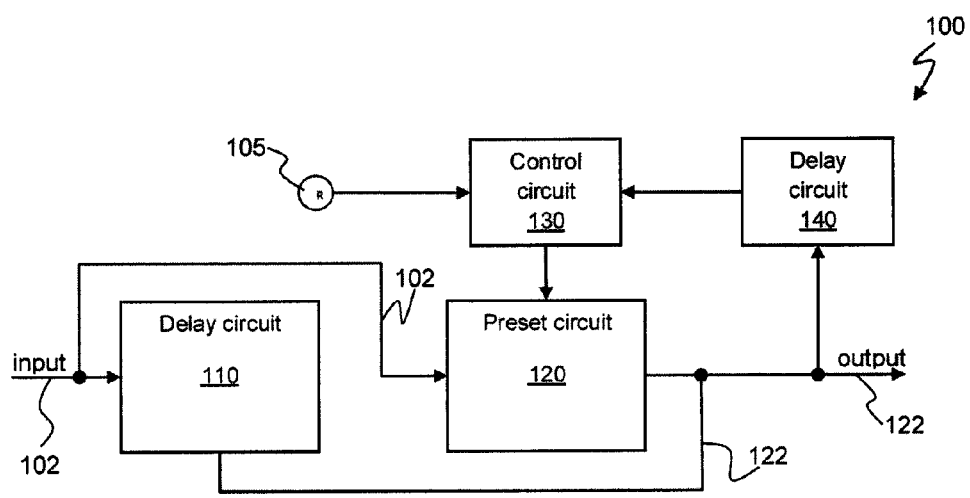
FIG. 1 shows a simplified block diagram of delay circuitry as one embodiment in accordance with the present invention.

FIG. 1 shows a simplified block diagram of delay circuitry 100 as one embodiment in accordance with the present invention. In the embodiment of FIG. 1, delay circuitry 100 may receive input signal 102 at a first logic level and may provide a delayed output signal 122 at a second logic level. As shown in FIG. 1, delay circuitry 100 includes a preset circuit (e.g., preset circuit 120) that is also coupled to receive input signal 102.

In the embodiment of FIG. 1, control circuit 130 and another delay circuit (e.g., delay circuit 140) may be coupled to preset circuit 120. Control circuit 130 may be operable to receive a configuration bit 105. In one embodiment, delay circuitry 100 may be a circuit block on a PLD and configuration bit 105 may be a memory bit from a configuration random access memory (CRAM) module. Accordingly, in one embodiment, preset circuit 120 may be turned on and off by control circuit 130 based on configuration bit 105. Preset circuit may be operable to drive or pre-drive output signal 122 and delay circuitry 100 may provide a delayed output 122 with compensated delay when preset circuit 120 is turned on.

When preset circuit 120 is turned on, output signal 122 may be pre-driven to an intermediate logic level before preset circuit 120 is turned off. In the embodiment of FIG. 1, delay circuit 140 is coupled to receive output signal 122 from preset circuit 120. Accordingly, delay circuit 140, coupled to control circuit 130 through feedback path 142, may be operable to turn off preset circuit 120 through control circuit 130 when output signal 122 reaches the intermediate logic level (e.g., preset circuit 120 may drive output signal 122 to the intermediate logic level before delay circuit 110 has driven the output to the second logic level). It should be appreciated that delay circuit 140 may include one or more inverters, one or more buffer circuits, or any other suitable circuits to provide an appropriate delay prior to turning off preset circuit 120.

As an example, delay circuitry 100 may receive an input signal 102 at a first logic level and provide a delayed output signal 122 at a second logic level. As such, preset circuit 120 may be used to pre-drive output signal 122 from the first logic level to an intermediate logic level that lies between the first and second logic levels. For instance, if input signal 102 is at a logic low level (or Vss) and delay circuitry 100 is operable to provide a delayed output signal 122 at a logic high level (or Vdd), preset circuit 120 may pre-drive output signal 122 to a logic level substantially close to ½ Vdd.

When preset circuit 120 is turned off (e.g., when output signal 122 reaches the intermediate logic level), output signal 122 may be further pulled from the intermediate logic level all the way to the second logic level by delay circuit 110. It should be appreciated that if preset circuit 120 is disabled (e.g., turned off by control circuit 130 through configuration bit 105), delay circuit 110 may provide an uncompensated delayed output signal 122. As such, output signal 122 may not be pre-driven to an intermediate logic level and the transition of an uncompensated output signal 122 from one logic level to another may be relatively more linear compared to a compensated output signal.

Figure 2:
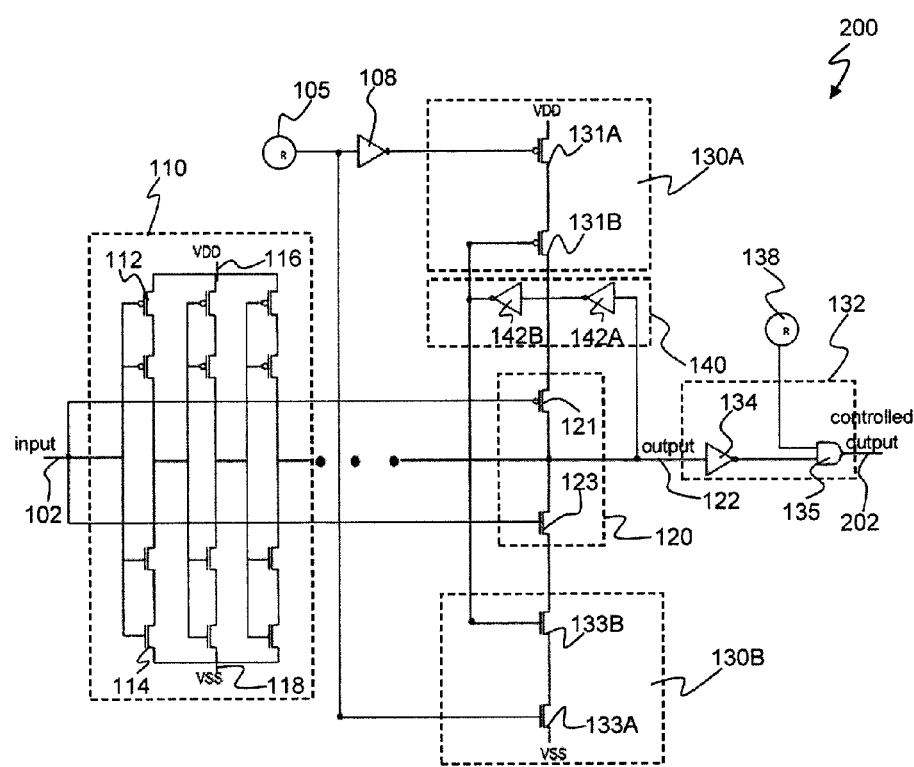
FIG. 2 shows illustrative delay circuitry with a plurality of transistors as one embodiment in accordance with the present invention.

FIG. 2 shows an illustrative delay circuitry 200 with a plurality of transistors as one embodiment in accordance with the present invention. It should be appreciated that delay circuitry 200 shows detailed representations of several circuit elements from FIG. 1 (e.g., delay circuit 110, control circuit 130, preset circuit 120, and delay circuit 140). In the embodiment of FIG. 2, delay circuit 110 may include a plurality of p-channel transistors 112 coupled to a plurality of n-channel transistors 114. It should be appreciated that the plurality of p-channel transistors 112 and n-channel transistors 114 may collectively form a plurality of inverters coupled in series. A source-drain terminal of the plurality of p-channel transistors 112 is coupled to a positive voltage level (e.g., Vdd) and a source drain terminal of the plurality of n-channel transistors 114 is coupled to a ground voltage (e.g., Vss).

Preset circuit 120 may also include a plurality of p-channel and n-channel transistors (e.g., p-channel transistor 121 and n-channel transistor 123). In one embodiment, the plurality of transistors in delay circuit 110 (p-channel transistors 112 and n-channel transistors 114) may have a first channel length while the plurality of transistors in preset circuit 120 (p-channel transistor 121 and n-channel transistor 123) may have a second channel length.

It should be appreciated that in the embodiment of FIG. 2, two pairs of p-channel and n-channel transistors (112 and 114, respectively) form an inverter in delay circuit 110 and a pair of p-channel 121 and n-channel 123 transistors form an inverter in preset circuit 120. As such, three inverter circuits are shown in delay circuit 110 in the embodiment of FIG. 2. However, it should be appreciated that there may be fewer or more inverter circuits may be coupled together in delay circuit 110. In one embodiment, each of the transistors 112, 114, 121 and 123 has a similar channel length.

Accordingly, having two p-channel transistors 112 (or n-channel transistors 114) coupled in series may effectively form a p-channel transistor (or n-channel transistor) with a longer channel length compared to a single p-channel transistor 121 (or n-channel transistor 123). In another embodiment, if transistors with longer channel lengths are used, inverter circuits in delay circuit 110 may be formed by a single pair of p-channel and n-channel transistors, each with a relatively longer channel length compared to p-channel transistors 112 and n-channel transistors 114. It should be appreciated that transistors (either p-channel or n-channel transistors) with shorter channel lengths may have a stronger drive strength compared to transistors with longer channel lengths.

In one embodiment, transistors 121 and 123 may be at least 3 times stronger compared to transistors 112 and 114. The stronger transistors in preset circuit 120 (e.g., p-channel transistor 121 and n-channel transistor 123) may be used to improve the transition of output signal 122 from one logic level to another, according to one embodiment. In this embodiment, transistors 121 and 123 of the preset circuit may drive output 122 with a larger amount of current than the two pairs of transistors 112 and 114 of delay circuit 110. Accordingly, output 122 of delay circuit 110 may be driven to the intermediate logic level at a faster rate by preset circuit 120 than by delay circuit 110 alone. In one embodiment, by driving output 122 of delay circuit 110 to an intermediate value using preset circuit 120, jitter associated with power supply variations, process variations, temperature variations, or other sources of noise may be reduced (e.g., because transistors having relatively high current driving capabilities may be less susceptible to noise).

In the embodiment of FIG. 2, the gate of each of transistors 121 and 123 is coupled to receive input signal 102. A source-drain terminal of p-channel transistor 121 is coupled to control circuit 130A and a source-drain terminal of n-channel transistor 123 is coupled to control circuit 130B. In one embodiment, control circuits 130A and 130B may be formed by two p-channel transistors 131A and 131B coupled in series and two n-channel transistors 133A and 133B coupled in series. It should be appreciated that control circuit 130A may be used to control p-channel transistor 121 of preset circuit 120 and control circuit 130B may be used to control n-channel transistor 123.

A source-drain terminal of p-channel transistor 131A is coupled to a positive voltage level (e.g., Vdd) and a source-drain terminal of n-channel transistor 133A is coupled to a negative voltage level (e.g., Vss). As described in the embodiment of FIG. 1, control circuit 130 may be coupled to receive a configuration bit 105. Accordingly, in the embodiment of FIG. 2, the gate of each of transistors 131A and 133A, of control circuits 130A and 130B respectively, are coupled to receive configuration bit 105. P-channel transistor 131A may be coupled to receive an inverted version of configuration bit 105 through inverter circuit 108 while n-channel transistor 133A may receive a non-inverted or unmodified version of configuration bit 105.

In one embodiment, when configuration bit 105 is at a logic high level (e.g., logic level 1) p-channel transistor 131A and n-channel transistor 133A may be turned on and preset circuit 120 may be enabled. When configuration bit 105 is at a logic low level (e.g., logic level 0) p-channel transistor 131A and n-channel transistor 133A may be turned off and preset circuit 120 may be disabled. It should be appreciated that in the embodiment of FIG. 2, when preset circuit 120 is turned off, output signal 122 may be driven solely by delay circuit 110 from a first logic level to a second logic level.

A delay circuit 140 is further coupled to control circuits 130A and 130B in the embodiment of FIG. 2. Delay circuit 140 may include two inverters 142A and 142B (or buffer circuits) coupled in series. It should be appreciated that even though two inverters 142A and 142B are shown in the embodiment of FIG. 2, fewer or more inverter (or buffer) circuits may be used in this context. In one embodiment, delay circuit 140 is coupled to receive output signal 122 and may provide a delayed output to control circuits 130A and 130B through a feedback path that couples delay circuit 140 to control circuits 130A and 130B.

In the embodiment of FIG. 2, the gate of each of transistors 131B and 133B of control circuits 130A and 130B, respectively, is coupled to receive the delayed output from delay circuit 140. In one embodiment, delay circuit 140 may be operable to disable or turn off preset circuit 120 through control circuits 130A and 130B.

Preset circuit 120, according to one embodiment, is operable to pre-drive output signal 122 to an intermediate logic level. In one embodiment, if the signal received (e.g., input signal 102) is at a logic low level, as output signal 122 transitions from the logic low level to a logic high level, p-channel transistor 121 of preset circuit 120 is operable to pre-drive or pull output signal 122 towards the logic high level (assuming preset circuit 120 is enabled by configuration bit 105 through control circuits 130A and 130B). In one embodiment, p-channel transistor 121 may be turned off by delay circuit 140 when output signal 122 reaches a threshold logic level (e.g., when output signal 122 reaches an intermediate logic level that lies between the logic low level and the logic high level) and output signal 122 may be driven by delay circuit 110 from the intermediate logic level to the logic high level.

Conversely, if input signal 102 is at a logic high level, as output signal 122 transitions from the logic high level to a logic low level, n-channel transistor 123 of preset circuit 120 is operable to pre-drive or pull output signal 122 towards the logic low level. N-channel transistor 123 may then be turned off by delay circuit 140 when output signal 122 reaches the threshold logic level and output signal 122 may be driven by delay circuit 110 from the intermediate logic level to the logic low level.

It should be appreciated that delay circuitry 200 may represent a single delay element and several delay elements similar to delay circuitry 200 may be coupled in series to form a delay chain. In the embodiment of FIG. 2, an enable circuit 132 may be coupled to the output of delay circuitry 200. Enable circuit 132 may include a logic gate (e.g., NAND gate 135) coupled to receive a configuration bit 138 that is operable to enable and disable delay circuitry 200. Enable circuit 132 may also include a driver circuit or a buffer circuit (e.g., inverter 134) that is operable to drive output signal 122. In the embodiment of FIG. 2, a controlled output 202 is provided by enable circuit 132. When several delay elements similar to delay circuitry 200 are coupled in series, each of the delay elements may be operable to provide a delayed output or a controlled delayed output similar to controlled output 202. Accordingly, any number of delay elements in the delay chain may be enabled or disabled to provide the desired delay.

Figure 3:
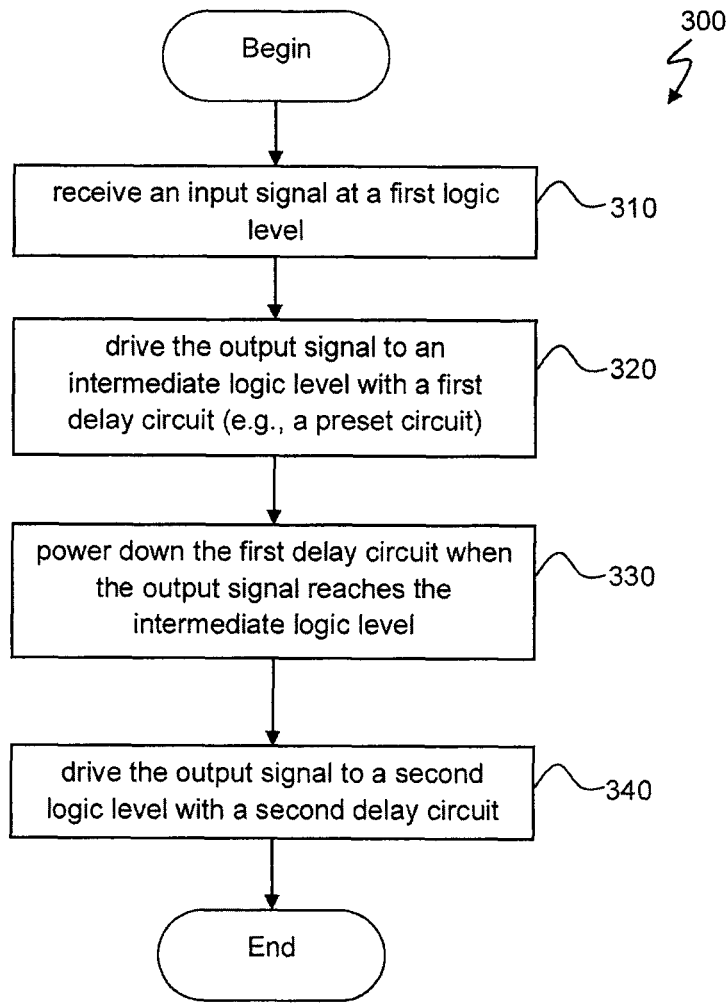
FIG. 3 shows a simplified flow for delaying an input signal to produce an output signal as one embodiment in accordance with the present invention.

FIG. 3, meant to be illustrative and not limiting, shows simplified flow 300 for delaying an input signal to produce an output signal as one embodiment in accordance with the present invention. At step 310, an input signal at a first logic level is received. The input signal may be received by a delay element similar to delay circuitry 100 of FIG. 1. The output signal may be driven to an intermediate logic level with a first delay circuit at step 320. In one embodiment, the first delay circuit may be a preset circuit (e.g., preset circuit 120 of FIGS. 1 and 2).

At step 330, the first delay circuit is powered down when the output signal reaches the intermediate logic level. In one embodiment, the first delay circuit may be coupled to control circuitry that is operable to enable and disable the first delay circuit. The control circuitry may further be operable to disable or power down the first delay circuit when the output signal reaches the intermediate logic level.

The output signal is then driven from the intermediate logic level to a second logic level with a second delay circuit at step 340. In the embodiment of FIGS. 1 and 2, output signal 122 is driven by delay circuit 110 from the intermediate logic level to the second logic level after preset circuit 120 is turned off.

Figure 4:
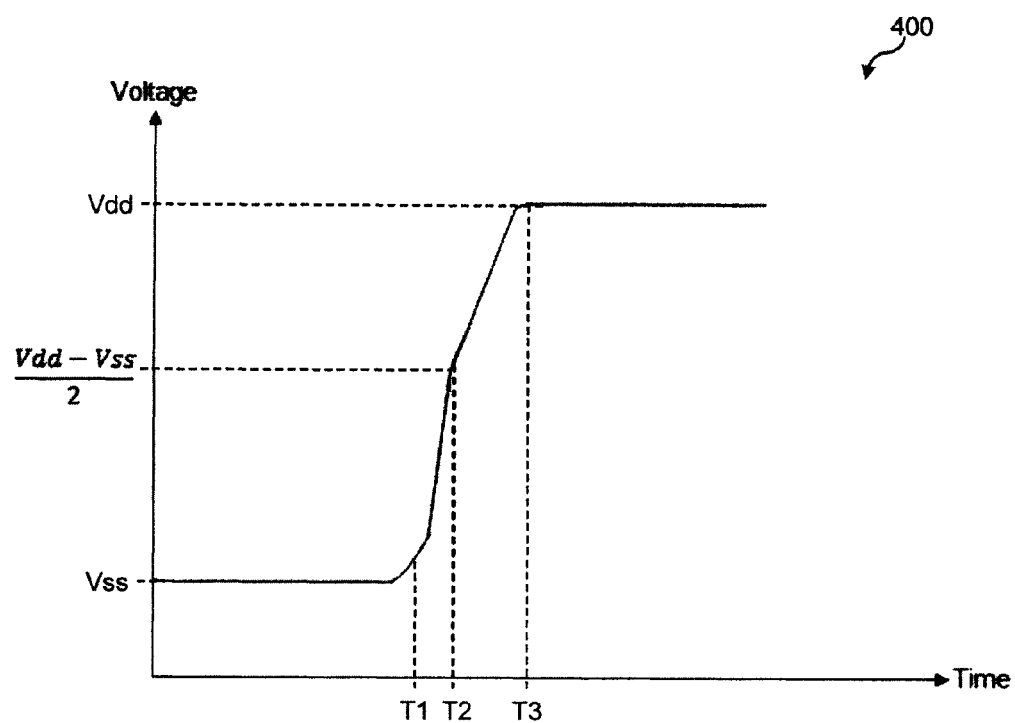
FIG. 4 shows an illustrative waveform of a signal transitioning from a logic low level to a logic high level.

FIG. 4 shows illustrative waveform 400 of a signal transitioning from a logic low level to a logic high level. In one embodiment, waveform 400 may represent a transition of input signal 102 of FIG. 1 as it is pulled by preset circuit 120 and delay circuit 110 to provide a delayed output signal 122. During the transition of the signal from a logic low level (e.g., Vss) to a logic high level (e.g., Vdd), the signal may be pre-driven from Vss to an intermediate logic level between Vss and Vdd from period T1 to T2. As such, in the embodiment of FIG. 4, the slope of waveform 400 as the signal transitions from Vss to approximately $$\frac{Vdd - Vss}{2}$$

may be relatively steeper than when the signal transitions from $$\frac{Vdd - Vss}{2}$$

to vdd (that is, the slope of the signal from T1 to T2 is relatively steeper than the slope from T2 to T3).

Occasionally, power supply noise may affect the transition of a signal. When there are voltage variations, the transition of the signal may be delayed. In one embodiment, by having the signal pre-driven for a period of time (e.g., from T1 to T2) any unwanted delay caused by variations in voltage levels may be mitigated. In the embodiment of FIG. 2, output signal 122 may be pre-driven by preset circuit 120 for a period of time (e.g., from T1 to T2), before being driven by delay circuit 110 after preset circuit 120 has been turned off (e.g., from T2 to T3) by delay circuit 140.

It should be appreciated that even though waveform 400 shows only the transition of a signal from a logic low level (Vss) to a logic high level (Vdd), the same concept may apply when the signal is transitioning from the logic high level (Vdd) back to the logic low level (Vss). In other words, the signal may be pre-driven for a period of time during its transition from the logic high level to an intermediate logic level (e.g., the halfway point between Vdd and Vss). As such, the resulting output waveform may have a relatively steeper downward slope during the period when the signal is transitioning from the logic high level to the intermediate logic level compared to when the signal is transitioning from the intermediate logic level to the logic low level.

Figure 5:
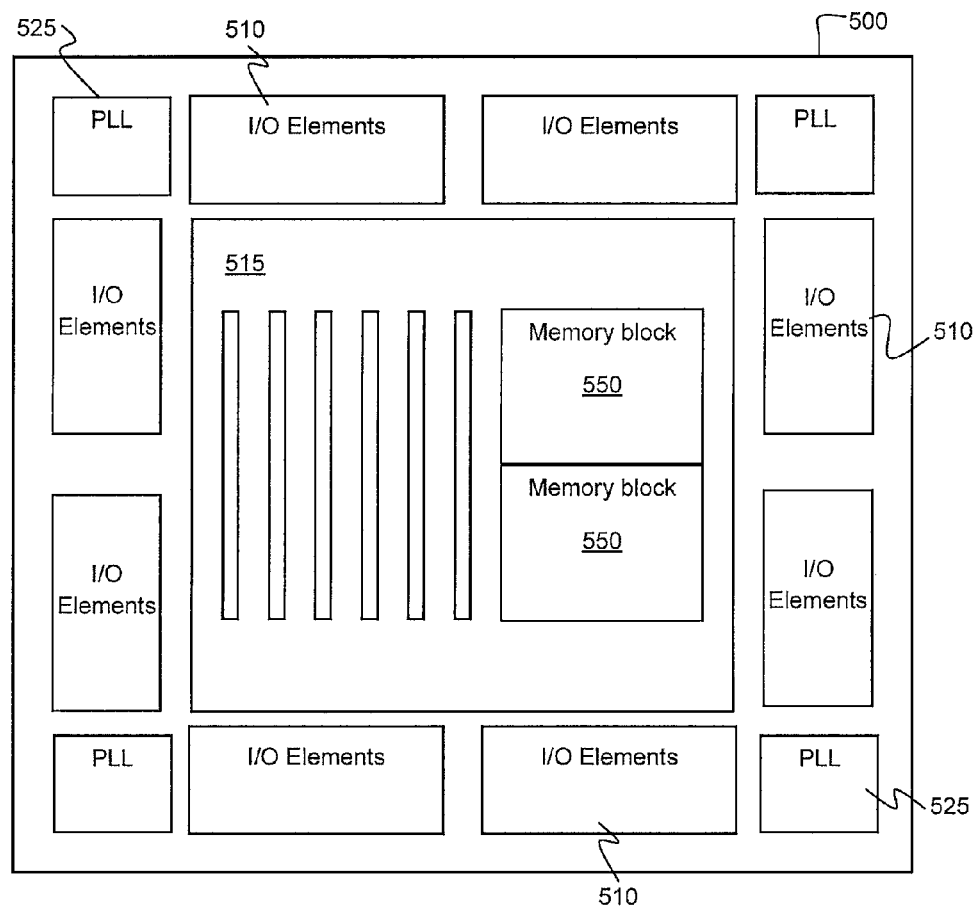
FIG. 5 is a simplified block diagram of an integrated circuit as one embodiment in accordance with the present invention.

FIG. 5, meant to be illustrative and not limiting, shows a simplified block diagram of IC 500 that can implement embodiments of the present invention. IC 500 includes core logic region 515 and input-output elements 510. Other auxiliary circuits such as phase-locked loops (PLLs) 525 for clock generation and timing, can be located outside the core logic region 515 (e.g., at corners of IC 500 and adjacent to input-output elements 510).

Core logic region 515 may be populated with logic cells that may include "logic elements" (LEs), among other circuits. LEs may include look-up table-based logic regions and may be grouped into "Logic Array Blocks" (LABs). The LEs and groups of LEs or LABs can be configured to perform logical functions desired by the user. Configuration data loaded into configuration memory can be used to produce control signals that configure the LEs and groups of LEs and LABs to perform the desired logical functions. Core logic region 515 may also include a plurality of embedded memory blocks 550 that can be used to perform a variety of functions.

Input-output elements 510 may also include input-output buffers that connect IC 500 to other external components. Signals from core region 515 are transmitted through input-output elements 510 to external components that may be connected to IC 500. A single device like IC 500 can potentially support a variety of different interfaces and each individual input-output bank 510 can support a different input-output standard with a different interface or a different voltage level.

Accordingly, IC 500 may receive signals from external circuitry at input-output elements 510 and the signals may be routed from input-output elements 510 to core logic region 515 and other logic blocks on IC 500. Core logic region 515 and other logic blocks on IC 500 may perform functions based on the signals received. Signals may be sent from core logic region 515 and other relevant logic blocks of IC 500 to other external circuitry or components that may be connected to IC 500 through input-output elements 510. It should be appreciated that delay elements similar to delay circuitry 200 of FIG. 2 may be included in logic region 515 to calibrate signals received at input-output elements 110.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An integrated circuit comprising:
   a delay circuit operable to receive an input signal having a first logic level and further operable to produce a delayed output signal at a second logic level at an output terminal; and
   a preset circuit coupled to the delay circuit, wherein the preset circuit is operable to receive the input signal and wherein the preset circuit is operable to pre-drive the delayed output signal to an intermediate logic level that is between the first and second logic levels.

2. The integrated circuit defined in claim 1 further comprising:
   a control circuit coupled to the preset circuit, wherein the control circuit is operable to receive an enable signal and further operable to enable and disable the preset circuit based at least partly on the enable signal.

3. The integrated circuit defined in claim 2 further comprising:
   an additional delay circuit operable to receive the delayed output signal from the preset circuit and further operable to provide a delayed feedback output signal to the control circuit, wherein the control circuit is operable to disable the preset circuit based at least partly on the delayed feedback output signal when the delayed output signal reaches the intermediate logic level.

4. The integrated circuit defined in claim 2, wherein the delay circuit comprises a first plurality of transistors each having a first channel length, wherein the preset circuit comprises a second plurality of transistors coupled in series and wherein each transistor of the second plurality of transistors has a second channel length.

5. The integrated circuit defined in claim 4, wherein the first plurality of transistors of the delay circuit comprises first and second transistors, wherein the control circuit comprises a third transistor coupled to the first transistor and a fourth transistor coupled to the second transistor, wherein a gate terminal of the third transistor is operable to receive an inverted version of the enable signal, and wherein a gate terminal of the fourth transistor is operable to receive the enable signal.

6. The integrated circuit defined in claim 2, wherein the integrated circuit is a programmable logic device, the integrated circuit further comprising:
   a programmable memory element operable to provide the enable signal to the control circuit.

7. The integrated circuit defined in claim 1 further comprising:
   a logic gate coupled between the output terminal and the preset circuit, wherein the logic gate is operable to receive the delayed output signal at a first input terminal, and further operable to receive an enable signal at a second input terminal, wherein the logic gate is operable to enable and disable the delay circuit and the preset circuit based on the enable signal.

8. A circuit comprising:
   a first plurality of transistors, at least one transistor of the first plurality of transistors having a first channel length, wherein the first plurality of transistors is operable to receive an input signal at a first logic level and further operable to produce an output signal at a second logic level; and
   a second plurality of transistors coupled in series, at least one transistor of the second plurality of transistors having a second channel length, the second plurality of transistors coupled in parallel to the first plurality of transistors, wherein the second plurality of transistors is operable to pre-drive the output signal to an intermediate logic level that is between the first logic level and the second logic level.

9. The circuit defined in claim 8, wherein the first channel length is greater than the second channel length.

10. The circuit defined in claim 8 wherein the output signal is produced at an output terminal of the first plurality of transistors, the circuit further comprising:
    a logic gate having a first input terminal operable to receive the output signal from the output terminal and a second input terminal operable to receive a configuration bit, wherein the configuration bit is operable to enable and disable the circuit.

11. The circuit defined in claim 8 further comprising:
    a delay circuit coupled to an output terminal of the circuit, and further coupled to the second plurality of transistors through a feedback path, wherein the delay circuit is operable to power down the second plurality of transistors when the input signal reaches the intermediate logic level.

12. The circuit defined in claim 11, wherein the second plurality of transistors comprises:
    a first transistor having a first source-drain terminal coupled to a first voltage level and having a gate coupled to receive an enable signal;
    a second transistor having a second source-drain terminal coupled to the first transistor, and having a gate coupled to the delay circuit; and
    a third transistor having a first source-drain terminal coupled to a second source-drain terminal of the second transistor, and having a second source-drain terminal coupled to the output terminal of the circuit, wherein a gate of the third transistor is coupled to receive the input signal at the first logic level, wherein the first transistor is operable to power down the second and third transistors based on the enable signal, and wherein the second transistor is operable to power down the third transistor when the input signal reaches the intermediate logic level.

13. The circuit defined in claim 12 further comprising:
a fourth transistor having a first source-drain terminal coupled to a second voltage level and having a gate coupled to receive an inverted version of the enable signal;
a fifth transistor having a first source-drain terminal coupled to the fourth transistor, and having a gate coupled to the delay circuit; and
a sixth transistor having a first source-drain terminal coupled to a second source-drain terminal of the fifth transistor, and having a second source-drain terminal coupled to the output terminal of the circuit and the second source-drain terminal of the third transistor, wherein a gate of the sixth transistor is coupled to receive the input signal at the first logic level, wherein the fourth transistor is operable to power down the fifth and sixth transistors based on the enable signal, and wherein the fifth transistor is operable to power down the sixth transistor when the input signal reaches the intermediate logic level.

14. The circuit defined in claim 13, wherein the first, second and third transistors are p-channel transistors, wherein the fourth, fifth and sixth transistors are n-channel transistors, and wherein each of the third and sixth transistors has the second channel length.

15. A method of delaying an input signal to produce an output signal comprising:
with a first delay circuit, receiving the input signal at a first logic level;
driving the output signal from the first logic level to an intermediate logic level with the first delay circuit;
with control circuitry, powering down the first delay circuit when the output signal reaches the intermediate logic level; and
driving the output signal from the intermediate logic level to a second logic level with a second delay circuit.

16. The method defined in claim 15, wherein the first delay circuit comprises a preset circuit, further comprising:
receiving an enable signal, wherein the enable signal is operable to enable and disable the preset circuit.

17. The method defined in claim 16, wherein the preset circuit is operable to pre-drive the output signal from the first logic level to the intermediate logic level.

18. The method defined in claim 15, wherein the intermediate logic level lies between the first logic level and the second logic level.

19. The method defined in claim 15 further comprising:
delaying the output signal prior to the powering down of the first delay circuit.

20. The method defined in claim 15 further comprising:
receiving a control signal; and
disabling the first and second delay circuits based on the control signal.

* * * * *